United States Patent
Baumann et al.

(10) Patent No.: US 12,392,838 B2
(45) Date of Patent: Aug. 19, 2025

(54) METHOD AND BATTERY MANAGEMENT SYSTEM FOR MONITORING A BATTERY SYSTEM BY DETERMINING IMPEDANCE

(71) Applicant: TWAICE Technologies GmbH, Munich (DE)

(72) Inventors: Michael Baumann, Munich (DE); Alexander Karger, Munich (DE); Arpit Maheshwari, Munich (DE)

(73) Assignee: TWAICE Technologies GmbH, Munich (DE)

( * ) Notice: Subject to any disclaimer, the term of this patent is extended or adjusted under 35 U.S.C. 154(b) by 255 days.

(21) Appl. No.: 17/802,629

(22) PCT Filed: Mar. 1, 2021

(86) PCT No.: PCT/EP2021/054982
§ 371 (c)(1),
(2) Date: Aug. 26, 2022

(87) PCT Pub. No.: WO2021/170866
PCT Pub. Date: Sep. 2, 2021

(65) Prior Publication Data
US 2023/0109406 A1    Apr. 6, 2023

(30) Foreign Application Priority Data
Feb. 28, 2020    (DE) ............... 10 2020 105 349.5

(51) Int. Cl.
*G01R 31/389* (2019.01)
*B60L 58/16* (2019.01)
(Continued)

(52) U.S. Cl.
CPC ............ *G01R 31/389* (2019.01); *B60L 58/16* (2019.02); *G01R 31/367* (2019.01);
(Continued)

(58) Field of Classification Search
CPC ................ G01R 31/389; G01R 31/367; G01R 31/3842; G01R 31/392
See application file for complete search history.

(56) References Cited

U.S. PATENT DOCUMENTS 6,118,275 A * 9/2000 Yoon .................... G01R 31/367
324/432
6,832,171 B2   12/2004 Barsoukov et al.
(Continued)

FOREIGN PATENT DOCUMENTS

CN    102901928 A    1/2013
CN    104977543 A    10/2015
(Continued)

OTHER PUBLICATIONS

Baumann et al., "Cloud-connected battery management for decision making on Second-Life of electric vehicle batteries," 2018, 2018 Thirteenth International Conference on Ecological Vehicles and Renewable Energies (EVER), pp. 1-6.
(Continued)

*Primary Examiner* — Ricky Go
(74) *Attorney, Agent, or Firm* — The Webb Law Firm

(57) ABSTRACT

A method for monitoring a battery system is proposed. The method includes providing a sequence of pairs of measured current and voltage values that follow one another in time. The pairs of current and voltage values indicate the current flowing through the battery system and the voltage present at the battery system. The method also provides for an electrical equivalent model of the battery system to be provided. The equivalent electrical model has several impedances connected in series. Initial impedance parameter values are provided for the impedances of the equivalent electrical model. The method provides for adjusting a first impedance parameter of an impedance of the equivalent electrical model based on the difference between a first
(Continued)

voltage value simulated based on the initial impedance parameter values and the first current value of the finite sequence and the first measured voltage value of the finite sequence. An optimized first impedance parameter value is thereby obtained. By minimizing the deviation of a sequence of simulated voltage values obtained on the basis of the electrical equivalent model and the first sequence of measured current values from the sequence of measured voltage values by adapting at least one further impedance parameter of the impedances of the electrical equivalent model, at least one optimized further impedance parameter value of the at least one further impedance parameter is obtained. A battery management system for carrying out the method is also proposed.

11 Claims, 4 Drawing Sheets

(51) Int. Cl.
  *G01R 31/367* (2019.01)
  *G01R 31/3842* (2019.01)
  *G01R 31/392* (2019.01)
  *H01M 10/42* (2006.01)
  *H01M 10/48* (2006.01)
(52) U.S. Cl.
  CPC ....... *G01R 31/3842* (2019.01); *G01R 31/392* (2019.01); *H01M 10/425* (2013.01); *H01M 10/48* (2013.01); *H01M 2010/4271* (2013.01); *H01M 2010/4278* (2013.01); *H01M 2220/20* (2013.01)

(56) References Cited

U.S. PATENT DOCUMENTS

| | | | |
|---|---|---|---|
| 7,847,557 B2 | 12/2010 | Yun et al. | |
| 9,205,755 B2 | 12/2015 | Lee | |
| 9,252,465 B2 | 2/2016 | Hariharan | |
| 9,428,071 B2 | 8/2016 | Lee | |
| 9,793,735 B2* | 10/2017 | Choi | H02J 7/02 |
| 10,386,422 B2 | 8/2019 | Christensen et al. | |
| 10,502,791 B1 | 12/2019 | Li et al. | |
| 2008/0054848 A1* | 3/2008 | Yun | G01R 31/389 320/134 |
| 2009/0096459 A1 | 4/2009 | Yoneda et al. | |
| 2011/0031938 A1 | 2/2011 | Ishikawa | |
| 2011/0301891 A1 | 12/2011 | Kim | |
| 2013/0030596 A1* | 1/2013 | Okada | G01R 31/389 700/297 |
| 2018/0045788 A1 | 2/2018 | Kawai et al. | |
| 2019/0094305 A1* | 3/2019 | Takechi | G01R 31/36 |
| 2020/0249281 A1* | 8/2020 | Ishii | G01R 31/367 |

FOREIGN PATENT DOCUMENTS

| | | |
|---|---|---|
| CN | 107526881 A | 12/2017 |
| CN | 107656215 A | 2/2018 |
| CN | 109633452 A | 4/2019 |
| CN | 109655759 A | 4/2019 |
| CN | 109932661 A | 6/2019 |
| CN | 110794319 A | 2/2020 |
| DE | 102014200343 A1 | 7/2015 |
| DE | 102016119166 A1 | 4/2017 |
| EP | 2963434 A1 | 1/2016 |
| GB | 2532726 A | 6/2016 |
| JP | 200997878 A | 5/2009 |
| JP | 2014102111 A | 6/2014 |
| JP | 2014202654 A | 10/2014 |
| JP | 2015224919 A | 12/2015 |
| JP | 2019152575 A | 9/2019 |
| WO | 2012156602 A1 | 11/2012 |
| WO | 2019156377 A1 | 8/2019 |

OTHER PUBLICATIONS

Karger et al. "Novel method for the on-line estimation of low-frequency impedance of lithium-ion batteries", Journal of Energy Storage, 2020, pp. 1-13, vol. 32, No. 101818.

* cited by examiner

METHOD AND BATTERY MANAGEMENT SYSTEM FOR MONITORING A BATTERY SYSTEM BY DETERMINING IMPEDANCE

CROSS-REFERENCE TO RELATED APPLICATIONS

This application is the United States national phase of International Application No. PCT/EP2021/054982 filed Mar. 1, 2021, and claims priority to German Patent Application No. 10 2020 105 349.5 filed Feb. 28, 2020, the disclosures of which are hereby incorporated by reference in their entirety.

BACKGROUND OF THE INVENTION

Field of the Invention

With the increasing spread of battery systems as a source of energy for transport vehicles, the analysis of the aging behavior of these battery systems is becoming increasingly important. The aging of the battery systems is reflected in particular in a changed impedance of the battery systems and their frequency response. There is therefore a desire to continuously monitor the impedance of the respective battery system during operation.

Description of Related Art

M. Baumann, S. Rohr and M. Lienkamp in the article "Cloud-connected battery management for decision making on Second Life of electric vehicle batteries", DOI: 10.1109/EVER.2018.8362355 proposes an approach for the non-recursive determination of impedance parameters of an electrical model of a battery system. Finite sequences of measurement parameters, referred to as measurement windows, are first stored and the impedance parameters are determined based on these measurement windows. The electrical model can also be referred to as an electrical equivalent model. The electrical model of the battery system can be illustrated in particular by an electrical equivalent circuit diagram.

SUMMARY OF THE INVENTION

The object of the present invention is to improve the known method. In particular, an improved determination of the parameters of the electrical equivalent model during operation is desired.

For this purpose, a method according to the main independent claim and a battery management system according to the additional independent claim are proposed. Advantageous configurations are specified in the dependent claims.

A method for monitoring a battery system is proposed. The method includes providing a sequence of pairs of measured current and voltage values that follow one another in time. The pairs of current and voltage values indicate the current flowing through the battery system and the voltage present at the battery system. The method also provides for an electrical equivalent model of the battery system to be provided. The equivalent electrical model has several impedances connected in series. Initial impedance parameter values are provided for the impedances of the equivalent electrical model. The method provides for adjusting a first impedance parameter of an impedance of the equivalent electrical model based on the difference between a first voltage value simulated based on the initial impedance parameter values and the first current value of the finite sequence and the first measured voltage value of the finite sequence. An optimized first impedance parameter value is thereby obtained. By minimizing the deviation of a sequence of simulated voltage values obtained on the basis of the electrical equivalent model and the first sequence of measured current values from the sequence of measured voltage values by adapting at least one further impedance parameter of the impedances of the electrical equivalent model, at least one optimized further impedance parameter value of the at least one further impedance parameter is obtained.

The battery system can be a single battery cell. In that case, the pairs of current and voltage values can indicate the current flowing through this battery cell and the voltage present at this battery cell. However, the battery system can also include several battery cells. The battery cells can be connected in parallel. The pairs of current and voltage values can then indicate the current flowing through the battery cells connected in parallel and the voltage present across the battery cells connected in parallel. The battery cells can also be connected in series. In this case, the pairs of current and voltage values can specify the current flowing through the series-connected battery cells and the voltage drop across all the series-connected battery cells. It is also conceivable for the battery system to have a plurality of subsystems connected in parallel of battery cells connected in series or a plurality of subsystems connected in series of battery cells connected in parallel. A battery system in the sense described above can also be a subsystem of a larger battery system.

It is also conceivable to provide not only pairs of current and voltage values, but also other measured values describing the current state of the battery system. For example, the temperature of the battery system at the corresponding point in time can also be provided for each of the pairs of current and voltage values.

Providing the measured values can include measuring the corresponding values. However, it is also conceivable that already measured and stored values are used. For example, the measured values can first be measured at the location of the battery system, temporarily stored there and then transmitted to another system via a wired or wireless communication point.

The initial impedance parameter values can be random impedance parameter values. However, the initial impedance parameter values can also be based on empirical values from battery systems with a similar structure. In particular, the initial impedance parameter values can also be based on laboratory measurements of battery systems of the same or a similar type to the battery system to be monitored.

Within the method, not only one further impedance parameter, but rather several further impedance parameters, in particular all further impedance parameters, can be adjusted when minimizing the deviation. The one additional impedance parameter or the multiple additional impedance parameters can in particular be associated with impedances of the electrical equivalent model with lower time constants.

In one embodiment of the method, the first impedance parameter is obtained by adding a product of the difference with a constant to the initial impedance parameter.

Such a simple calculation can allow the method to be carried out in real time.

Furthermore, an exemplary embodiment of the method provides that a correction voltage calculated on the basis of the initial parameter values, the first measured current value and the first measured voltage value is used when minimizing the deviation.

Furthermore, in one configuration of the method, at least one impedance of the electrical equivalent model has a current-dependent resistance.

This can map a charge transfer resistance of the battery system, so that the equivalent electrical model represents the battery system more realistically.

In one embodiment of the method, a trust region method is used when minimizing the deviation. This can further simplify the determination of the impedance parameter values for the non-linear optimization problem.

When minimizing the deviation for the optimized further impedance value of the at least one further impedance parameter, this can also make it possible to obtain a more realistic value that better maps the real battery system. In some configurations, the use of a trust region method can also help to reduce the computing time required to minimize the deviation.

Another exemplary embodiment provides that the finite sequence is selected from a longer sequence of pairs of measured current and voltage values, and that a pair of the longer sequence is selected as the first pair of the finite sequence after a predetermined number of pairs of the longer sequence, in which the current value remains essentially constant or the amount of the quotient of the current value and a nominal capacity, the quotient also being referred to as the C rate, of the battery system is lower than a predetermined maximum C rate.

The longer sequence can in particular be pairs of measured current and voltage values which are measured continuously during operation, in particular in a continuous flow of data during operation where there is no defined end. As long as current and voltage values are measured, the time series under consideration continues almost indefinitely. Typically, only a longer sequence of pairs of current and voltage values of a defined length from the continuous data flow is considered. The longer sequence includes more pairs of measured current and voltage values than the finite sequence.

This can make it possible for the optimized first impedance parameter value and the optimized further impedance parameter value to be determined as independently as possible of current and voltage values that are not part of the finite sequence.

Furthermore, in one embodiment, the finite sequence comprises a sub-sequence of predetermined length for which the magnitude of the quotient of the current value and the nominal capacity of the battery system is higher than a predetermined minimum C rate ($C_{Rmin}$).

This can reduce the risk that not all physical effects that determine the impedance of a battery system and that are represented in the equivalent electrochemical model are sufficiently excited. In this way, a more precise determination of the impedance parameter values of the electrical equivalent model can be made possible.

An exemplary embodiment of the method provides that the optimized first impedance parameter and the optimized further impedance parameter or parameters are used as initial impedance parameter values of a subsequent finite sequence.

Typically, the change in impedance parameter values of a battery system is rather small over a short period of time. Using the impedance parameter values determined in a first iteration of the method as initial impedance parameter values for the subsequent iteration can accelerate the determination of the optimized impedance parameter values in the subsequent iteration.

A battery management system is also proposed, which is set up to carry out one of the methods described above. The battery management system can be used at the location of the battery system. However, it is also conceivable for the battery system to be provided at a location that is separate from the battery system. For example, the battery management system can be implemented by a server that receives the measured values from the battery management system via a wireless or wired communication. The measured values can be temporarily stored at the location of the battery system or in the cloud.

In one embodiment, the battery management system comprises means for measuring the pairs of measured current and voltage values and a memory for storing the finite sequence of the pairs. The memory can in particular have a ring memory. Storing the measured values in the cloud is also conceivable.

BRIEF DESCRIPTION OF THE DRAWINGS

Exemplary embodiments are illustrated below with the aid of the drawings. In particular

DESCRIPTION OF THE INVENTION

Figure 1:
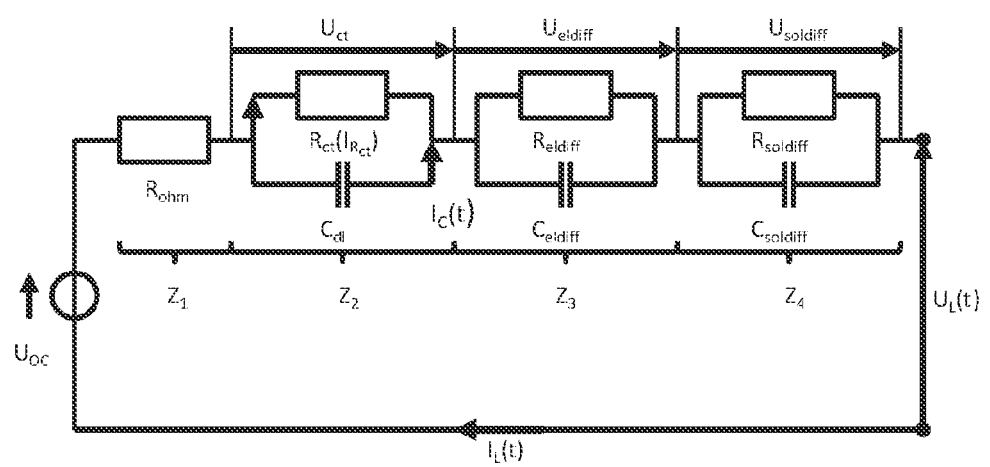
FIG. 1 shows an example of an electrical equivalent model.

FIG. 1 shows an example of an electrical equivalent model that can be used to monitor a battery system. The electrical equivalent model includes an ideal voltage source, which provides a source voltage $U_{OC}$ and four series-connected impedances $Z_1$, $Z_2$, $Z_3$ and $Z_4$. The impedance $Z_1$ is a purely ohmic resistance $R_{ohm}$ and the impedances $Z_2$, $Z_3$ and $Z_4$ are RC elements. The equivalent electrical model may also have a lesser or greater set of impedances connected in series. It is also conceivable that the impedances also include other impedance elements as an alternative or in addition to the RC elements. For example, the impedances of the equivalent electrical model can also include constant phase elements (constant phase element, CPE), in particular Warburg elements, and/or ZARC elements.

In the exemplary embodiment shown in FIG. 1, the impedance $Z_1$ includes a current-dependent resistance $R_{ct}$ ($I_{R_{ct}}$) which represents the resistance during charge transfer, and a capacitance $C_{dl}$ which represents the double-layer capacitance of the battery system. The impedance $Z_2$ has a resistance $R_{eldiff}$ and a capacitance $C_{eldiff}$ and represents electrolytic diffusion processes in the battery system. The impedance $Z_3$ includes a resistance $R_{soldiff}$ and a capacitance $C_{soldiff}$ and represents a solid state diffusion effect. It should be noted that the electrical equivalent model does not describe the physical processes exactly, but is only based on them in order to be able to parameterize the battery system in a meaningful way.

The voltage drop across the load and provided by the battery system $U_L(t)$ is made up of the source voltage $U_{OC}(t)$ of the ideal voltage source and the voltages across the individual impedances $Z_1$, $Z_2$, $Z_3$, $Z_4$ of the equivalent circuit and can be expressed as follows:

$$U_L(t)=U_{OC}(t)+R_{ohm}I_L(t)+U_{ct}(t)+U_{eldiff}(t)+U_{soldiff}(t) \qquad (1)$$

In discrete form, the voltage $U_{L,k}$ provided by the battery system at time k can be expressed as follows:

$$U_{L,k} = U_{OC,k} + R_{ohm}I_{L,k} + U_{ct,k} + V_{eldiff,k} + U_{soldiff,k} \quad (2)$$

The following applies $$U_{ct,k} = U_{1,k-1} e^{\frac{-\Delta t_k}{R_{ct,k}c_{dl}}} + R_{ct,k} \cdot I_{L,k}\left(1 - e^{\frac{\Delta t_k}{R_{ct,k}C_{dl}}}\right) = \quad (3)$$

$$U_{ct,k-1} e^{\frac{-\Delta t_k}{\tau_{ctdl}}} + R_{ct,k} \cdot I_{L,k}\left(1 - e^{\frac{\Delta t_k}{\tau_{ctdl}}}\right)$$

With $$R_{ct,k} = R_1\left(\frac{\ln\left(k_1(I_{L,k} - I_{C,k-1}) + \sqrt{(k_1(I_{Lk} - I_{Ck-1}))^2 + 1}\right)}{k_1(I_{L,k} - I_{C,k-1})}\right) \quad (4)$$

and $$I_{C,k} = I_{L,k} - \frac{U_{1,k}}{R_{ct,k}} \quad (5)$$

as well as $$U_{eldiff,k} = U_{eldiff,k-1} e^{\frac{-\Delta t_k}{R_{eldiff}C_{eldiff}}} + R_{eldiff} \cdot I_{L,k}\left(1 - e^{\frac{\Delta t_k}{R_{eldiff}C_{eldiff}}}\right) = \quad (6)$$

$$U_{eldiff,k-1} e^{\frac{-\Delta t_k}{\tau_{eldiff}}} + R_{eldiff} \cdot I_{L,k}\left(1 - e^{\frac{\Delta t_k}{\tau_{eldiff}}}\right)$$

and $$U_{soldiff,k} = U_{soldiff,k-1} e^{\frac{-\Delta t_k}{R_{soldiff}C_{soldiff}}} + R_{soldiff} \cdot I_{L,k}\left(1 - e^{\frac{\Delta t_k}{R_{soldiff}C_{soldiff}}}\right) = \quad (7)$$

$$U_{soldiff,k-1} e^{\frac{-\Delta t_k}{\tau_{soldiff}}} + R_{soldiff} \cdot I_{L,k}\left(1 - e^{\frac{\Delta t_k}{\tau_{soldiff}}}\right)$$

The electrical equivalent model can therefore be described by the parameter set $$P = \{R_{ohm}, R_1, K_1, C_{dl}, R_{eldiff}, C_{eldiff}, R_{soldiff}, C_{soldiff}\}$$

or.

$$P = \{R_{ohm}, R_1, k_1, \tau_{ctl}, R_{eldiff}, \tau_{eldiff}, R_{soldiff}, \tau_{soldiff}\}$$

The numerical stability of the system can be increased by not determining the time constants $\tau_{ctl}$, $\tau_{eldiff}$, $\tau_{soldiff}$ when adapting the electrical equivalent model to actually measured values so that the electrical equivalent model can be described by the reduced parameter set $$P_{sim} = \{R_{ohm}, R_1, k_1, R_{eldiff}, R_{soldiff}\}$$

In some exemplary embodiments, it can be assumed that the time constants $\tau_{ctl}$, $\tau_{eldiff}$, $\tau_{soldiff}$ change only slightly as the battery system ages. The time constants $\tau_{ctl}$, $\tau_{eldiff}$, $\tau_{soldiff}$ for the battery system to be examined can be determined in advance as part of laboratory measurements. However, it is also conceivable that the time constants $\tau_{ctl}$, $\tau_{eldiff}$, $\tau_{soldiff}$ change over time and this should be taken into account when monitoring the battery system.

Figure 2:
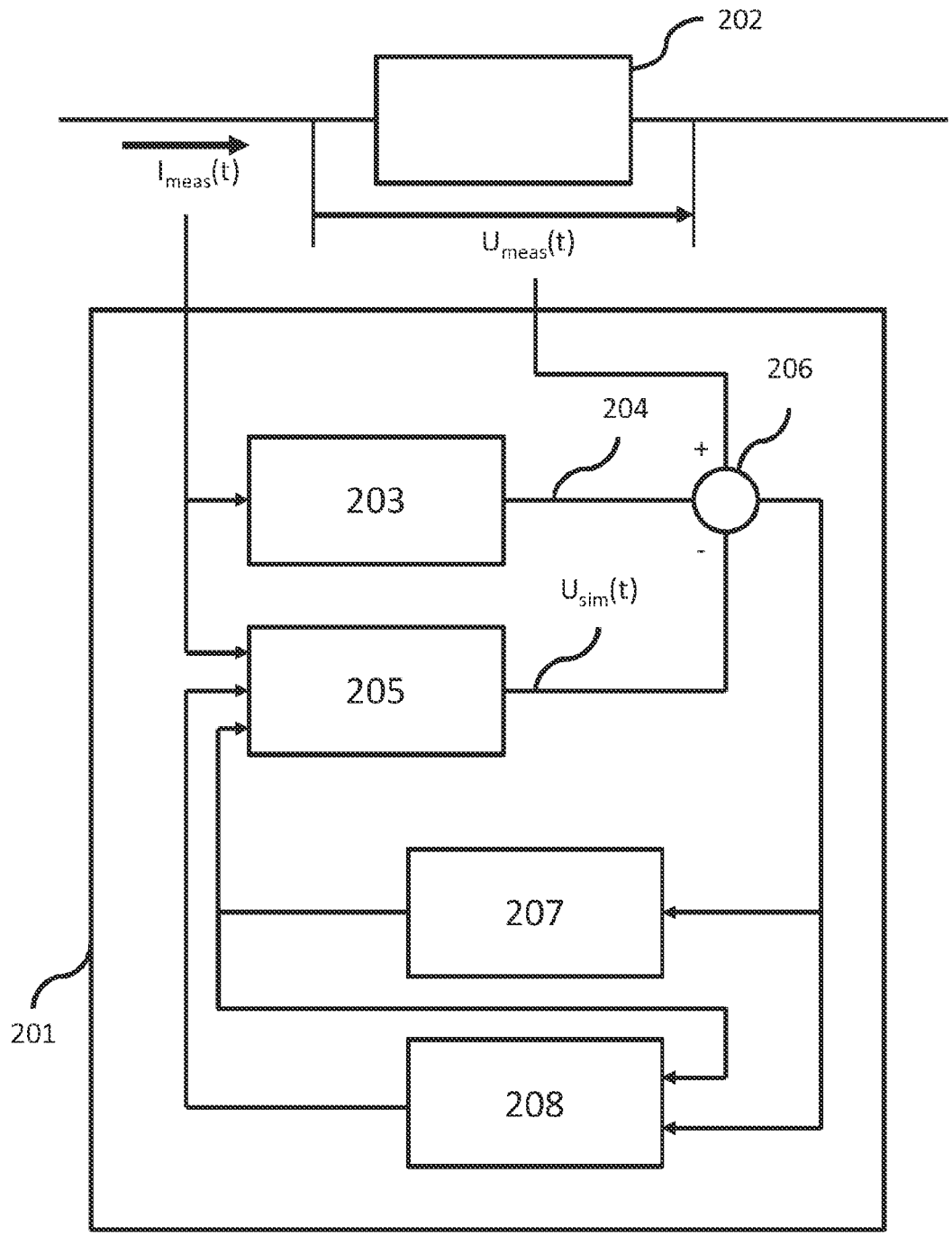
FIG. 2 shows an example of a battery management system.

As shown in FIG. 2, a battery management system 201 can measure the current $I_{meas}(t)$ flowing through a battery system 202 and the voltage $U_{meas}(t)$ provided by the battery system 202.

The measurements can in particular be carried out consecutively at discrete points in time $t_n$, $n \in [1, N]$ so that a continuous s sequence of measurement pairs $(I_{meas,n}; U_{meas,n}) = (I_{meas}(t_n); U_{meas}(t_n))$ is obtained.

Alternatively, the measurement pairs can also be obtained separately and made available to the battery management system, for example by means of wireless data transmission.

A battery management system 201 can be understood to mean any system that is set up to monitor a battery system. The battery management system 201 can have, for example, a number of separate components that communicate with one another via wireless or wired interfaces. In particular, the battery management system 201 can have an observer which is set up to determine impedance parameter values of an electrical equivalent model of the battery system. The battery management system 201 can be set up, for example, to determine changes in these impedance parameter values due to aging effects.

Figure 3:
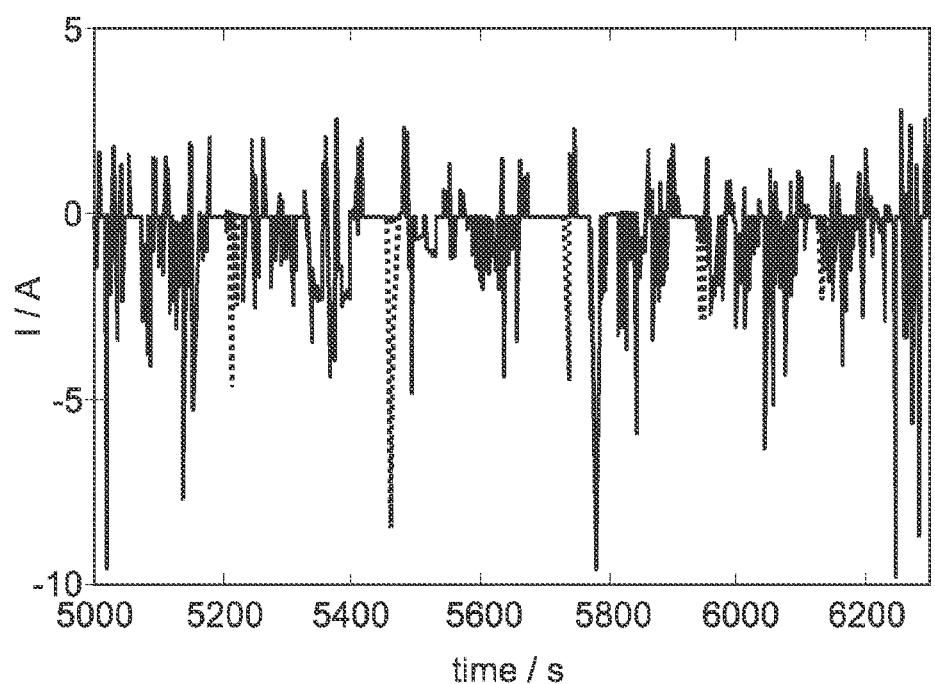
FIG. 3 shows an exemplary sequence of current and voltage pairs.

FIG. 3 shows a sequence of measured values $I_{meas,n}$ of the current I in amperes over the time t in hours for the exemplary battery system 202. The battery system 202 can be, for example, a battery system 202 of an electric motor vehicle, with the measured values $I_{meas,n}$ indicating the current which is used to accelerate the motor vehicle or is supplied back to the battery system 202 during recuperation when the motor vehicle is braked.

Figure 4:
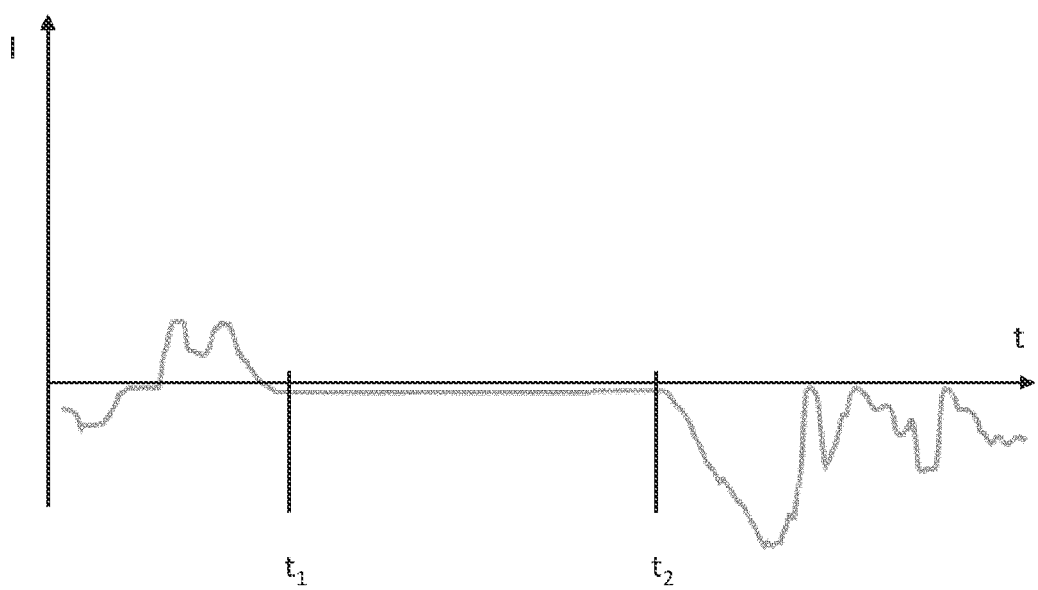
FIG. 4 shows a section of the sequence from FIG. 3.

FIG. 4 shows a partial sequence of the sequence of measured values $I_{meas,n}$ of the current I in amperes over time t in seconds.

As stated above, the battery management system 201 is provided with a sequence of pairs of measured current and voltage values. A finite sequence of pairs of measured current and voltage values is selected from this longer sequence of pairs of measured current and voltage values.

In FIG. 3, examples of finite sequences selected from the longer sequence are highlighted with dots. The chosen finite sequences can also be called windows.

A pair of the longer sequence can be selected as the first pair of the finite sequence after a predetermined number of pairs of the longer sequence in which the current value remains substantially constant or the magnitude of the quotient of the current value and the nominal capacity of the battery system 202 is less than a predetermined one maximum C rate $C_{max}$.

FIG. 4 shows a section of the longer sequence shown in FIG. 3, which includes a finite sequence. From a point in time $t_1$ to a point in time $t_2$, the current value I remains approximately constant. In particular, the magnitude of the quotient of the current value and the nominal capacity of the battery system 202 remains lower than a predetermined maximum C rate $C_{max}$. Consequently, the first pair after time $t_2$ of the sequence shown in FIG. 4 can be selected as the first pair of the finite sequence. The selected finite sequence also includes a sub-sequence of predetermined length for which the magnitude of the quotient of the current value and the rated capacity of the battery system is higher than a predetermined minimum C-rate $C_{min}$.

A window determination unit 203 can be used to select the finite sequence. The window determination unit 203 can generate a trigger signal 204 which causes the determination of the impedance parameters to start.

To this end, the system can have a model unit 205 which is set up to calculate a simulated voltage drop across the battery system 202 $U_{sim}(t)$ based on the measured current $I_{meas}$. In particular, an electrical equivalent model of the battery system 202 as described above can be mapped with the model unit 205. For this purpose, the model unit 205 can be provided with initial impedance parameter values.

A difference between the measured voltage $U_{meas}(t_1)$ and the simulated voltage $U_{sim}(t_1)$ for the first pair of values of the finite sequence can be used to determine an optimized first impedance parameter value. For this purpose, the battery management system 201 can have a low-frequency adjustment unit 207.

The first impedance parameter can be the resistance $R_{soldiff}$ of the above said equivalent electrical model. The first impedance parameter can be adjusted by adding a product of the difference in voltages with the initial first impedance parameter value and a constant to obtain an optimized first impedance parameter value:

$$R_{soldiff,opt} = R_{soldiff,init} + R_{soldiff,init} * (U_{meas(t_1)} - U_{sim(t_1)}) * K_p \quad (8)$$

The optimized first impedance parameter value can then be used when adapting the further impedance parameter values. The calculation of the optimized first impedance parameter value according to formula (8) can also be repeated several times, with the optimized impedance parameter value determined in the previous iteration $R_{soldiff,opt}$ and the other initial impedance parameter values being used for the determination of $U_{sim(t_1)}$.

The battery system 201 can also have a high-frequency adjustment unit 208. The high-frequency unit 208 can be set up to determine the further impedance parameter values based on the finite sequence.

The mean square error of the overall model can be determined by $$E_{RMS} = \sqrt{\frac{\sum_{k=1}^{K}(U_{L,k} - U_{meas,k})^2}{K}} \quad (9)$$

A diffusion overvoltage can be introduced to minimize the influence of superimposed diffusion parameters:

$$U_{err,2} = U_{OC,1} + R_{ohm}I_{L,1} + U_{ct,1} + U_{eldiff,1} - U_{meas,1} \quad (10)$$

This can allow the influence of superimposed diffusion parameters to be kept low when minimizing the deviation.

It can be assumed that the diffusion overvoltage $U_{err,2}$ remains constant during the time of the finite sequence.

The following cost function can then be minimized to determine the further optimized parameter values:

$$f_{cost} = \sum_{k=1}^{K}(U_{L,k} - U_{meas,k} - U_{err,2})^2 \to \min. \quad (11)$$

In this way, the further optimized parameter values can be obtained. In principle, it is also conceivable to determine the further optimized parameter values using another cost function that minimizes the deviation $(U_{L,k} - U_{meas,k} - U_{err,2})$.

In conclusion, the proposed method allows a battery system to be monitored, with the impedance parameters of an electrical equivalent model being able to be determined. The separation of the determination of a first impedance parameter value, which can be assigned to an impedance with a high time constant, from the determination of the at least one impedance parameter value, which can be assigned to an impedance with a low time constant, allows a more accurate and faster determination of the impedance parameter values.

The invention claimed is:

1. A method for determining one or more impedance parameters of a battery system, comprising:
    providing a finite sequence of pairs of measured current and voltage values $(I_{meas,k}; U_{meas,k})$ that follow one another in time, the pairs of current and voltage values $(I_k; U_k)$ indicating the current $(I_L)$ flowing through the battery system and the voltage $(U_L)$ present at the battery system at the corresponding point in time;
    providing an electrical equivalent model of the battery system, wherein the electrical equivalent model has series-connected impedances $(Z_1, Z_2, Z_3, Z_4)$;
    providing initial impedance parameter values $(R_{ohm,initial}; R_{ct,initial}; R_{eldiff,initial}; R_{soldiff,initial})$ of the impedances of the equivalent electrical model;
    adapting a first impedance parameter $(R_{soldif})$ of an impedance $(Z_4)$ of the equivalent electrical model based on the difference between a first impedance parameter based on the initial impedance values $(R_{ohm,0}; R_{ct,0}; R_{eldiff,0}; R_{soldiff,0})$ and the first current value $(I_1)$ of the finite sequence of simulated voltage values $(U_{sim,1})$ and the first measured voltage value $(U_{meas,1})$ of the finite sequence, whereby an optimized first impedance parameter value $(R_{soldif,optimated})$ is obtained;
    minimizing the deviation of a sequence of simulated voltage values $(U_{sim,k})$ obtained on the basis of the equivalent electrical model and the first sequence of measured current values $(I_{meas,k})$ and the sequence of measured voltage values $(U_{meas,k})$ by adapting at least one further impedance parameter $(R_{ohm}; R_{ct}; R_{eldiff})$ of the impedances $(Z_0, Z_1, Z_2, Z_3, Z_4)$ of the equivalent electrical model, whereby an optimized further impedance parameter value $(R_{ohm,optimal}; R_{ct,optimal}; R_{eldiff,optimal})$ of the at least one further impedance parameter is obtained,
    wherein the optimized first impedance parameter and the optimized further impedance parameters are used as initial impedance parameter values of a subsequent finite sequence, thereby improving subsequent determinations of impedance parameters.

2. The method of claim 1,
    wherein the first impedance parameter $(R_{soldif})$ is adjusted by adding a product of the difference with the initial first impedance parameter value and a constant to the initial first impedance parameter value.

3. The method of claim 1,
    wherein, when minimizing the deviation, a correction voltage is used which is calculated on the basis of the initial parameter values, the first measured current value and the first measured voltage value.

4. The method of claim 1,
    wherein at least one impedance has a current-dependent resistance.

5. The method of claim 1,
    wherein a trust region method is used to minimize the deviation.

6. The method of claim 5,
    wherein the finite sequence comprises a subsequence of predetermined length for which the magnitude of the quotient of the current value and the nominal capacity of the battery system is higher than a predetermined minimum C-rate $(C_{min})$.

7. The method of claim 1,
    wherein the finite sequence is selected from a longer sequence of pairs of measured current and voltage values $(I_{meas,k}; U_{meas,k})$, and
    wherein as the first pair of the finite sequence a pair of the longer sequence is selected after a predetermined number of pairs of the longer sequence in which the current value remains substantially constant or the magnitude of the quotient of the current value and a nominal capacity of the battery system is less than a predetermined maximum C-rate ($CR_{max}$).

8. The method of claim 1,
wherein the optimized first impedance parameter and the optimized further impedance parameters are used as initial impedance parameter values of a subsequent finite sequence.

9. A battery management system, wherein the battery management system is set up to carry out a method according to claim 1.

10. The battery management system of claim 9, wherein the battery management system has
means for measuring the pairs of measured current and voltage values ($I_{meas,k}$; $U_{meas,k}$); and
a memory for storing the finite sequence of pairs.

11. The battery management system of claim 10, wherein the memory has a ring memory.

* * * * *

UNITED STATES PATENT AND TRADEMARK OFFICE
CERTIFICATE OF CORRECTION

| | | |
|---|---|---|
| PATENT NO. | : 12,392,838 B2 | Page 1 of 1 |
| APPLICATION NO. | : 17/802629 | |
| DATED | : August 19, 2025 | |
| INVENTOR(S) | : Michael Baumann et al. | |

It is certified that error appears in the above-identified patent and that said Letters Patent is hereby corrected as shown below:

In the Claims

Column 8, Line 1, Claim 1, delete "($I_K$:" and insert -- ($I_k$; --

Signed and Sealed this
Twenty-first Day of October, 2025

John A. Squires
*Director of the United States Patent and Trademark Office*